United States Patent [19]

Beinvogl

[11] 4,360,414

[45] Nov. 23, 1982

[54] METHOD OF PRODUCING STRUCTURES COMPRISED OF LAYERS CONSISTING OF SILICIDES OR SILICIDE-POLYSILICON BY REACTIVE SPUTTER ETCHING

[75] Inventor: Willy Beinvogl, Munich, Fed. Rep. of Germany

[73] Assignee: Siemens Aktiengesellschaft, Berlin & Munich, Fed. Rep. of Germany

[21] Appl. No.: 322,887

[22] Filed: Nov. 19, 1981

[30] Foreign Application Priority Data

Dec. 5, 1980 [DE] Fed. Rep. of Germany ....... 3045922

[51] Int. Cl.$^3$ ............................................. C15C 15/00
[52] U.S. Cl. .................................................. 204/192 E
[58] Field of Search .................................... 204/192 E

[56] References Cited

U.S. PATENT DOCUMENTS 4,174,251 11/1979 Paschke ........................ 204/192 E
4,283,249 8/1981 Ephrath ......................... 204/192 E

FOREIGN PATENT DOCUMENTS 15403 2/1980 European Pat. Off. ............ 156/643
53-68978 6/1978 Japan ............................. 204/192 E

OTHER PUBLICATIONS

Clark, IBM Technical Disclosure Bulletin vol. 20 (1971), p. 1386.
Curtis et al., J. Electrochem. Soc. 125 (1978), pp. 829-830.
Parrens, J. Vac. Sci. Technol. 19 (1981), pp. 1403-1407.
Chemical Abstracts, vol. 85, (1976) p. 562, paragraphs 85-201113t and 85:201114u.
B. L. Crowder et al., Transactions on Electron Devices, vol. ED-26 (1979), pp. 369-371.

*Primary Examiner*—Arthur P. Demers
*Attorney, Agent, or Firm*—Hill, Van Santen, Steadman, Chiara & Simpson

[57] ABSTRACT

Circuit structures consisting of layers composed of metal silicides or metal silicide-polysilicon are produced by reactive sputter etching with sulfur hexafluoride ($SF_6$) as the etching gas. In a practice of the invention, the etching process occurs in two steps whereby the first etching step is carried out with a high frequency power of more than 0.3 W/cm$^2$ and the second etching step is carried out with a high frequency power of less than 0.2 W/cm$^2$. This method is strictly anisotropic, even when a photosensitive resist is used as an etching mask, and is useful in the manufacture of fully integrated semiconductor circuits in MOS technology with metal silicide layers for reduction of the ohmic resistance of polysilicon.

8 Claims, 2 Drawing Figures

METHOD OF PRODUCING STRUCTURES COMPRISED OF LAYERS CONSISTING OF SILICIDES OR SILICIDE-POLYSILICON BY REACTIVE SPUTTER ETCHING

BACKGROUND OF THE INVENTION

1. Field of the Invention

The invention relates to a method of producing circuit structures and somewhat more particularly to producing layered structures consisting of silicides or silicide-polysilicon on substrates containing integrated semiconductor circuits by reactive sputter etching (ion etching) with sulfur hexafluoride as the etching gas and with the use of photosensitive resist etching masks.

2. Prior Art

Anisotropic etching techniques are used in etching technology for manufacture of fully integrated MOS circuits in order to insure a true-to-scale structure transfer. This type of anisotropic etching technique is described in *Chemical Abstracts*, Volume 85 (1976) Page 562, paragraphs 85:20 11 13 t and 85:20 11 14u. With these techniques, structures of a magnitude of 10 μm are produced in polysilicon layers by reactive sputter etching with a mixture of gaseous oxygen and carbon tetrafluoride and with etching masks formed from films of photosensitive resist. In this process, the etching profile of the structures generated in the polysilicon layers is largely dependent on the thickness of the silicon layer and on the supplied high frequency power.

In order to reduce ohmic resistance of polysilicon lines in the manufacture of integrated circuits in MOS technology, the polysilicon lines are replaced by metal silicides or by applying an additional metal silicide layer (sometimes referred to as a "polycide" layer) on the polysilicon lines. In practicing this technique so as to be able to obtain generation of structures having a size in the range of 1 μm, anisotropic etching techniques must be utilized. An anisotropic etching technique for a silicide in which $CF_4$ is utilized as the etching gas is described in an article by B. L. Crowder et al, *Transactions on Electron Devices*, Vol. ED-26, (1979) pages 369–371. The described method is strictly anisotropic, however, because of its poor selectivity relative to the silicide, photosensitive resists cannot be utilized for the etching masks. Other masks, for example composed of aluminum, are possible but complicate the processing sequence. Yet a further disadvantage of this process is that the selectivity of polysilicon relative to $SiO_2$ only amounts to approximately 2:1.

Published L. D. Forget et al European Patent Application No. 0015403 (1980) suggests that a further selectivity of polysilicon to $SiO_2$ and $Si_3N_4$ can be obtained by utilizing an etching gas mixture consisting of sulfur hexafluoride ($SF_6$), chlorine and and inert gas in etching silicon substrates.

SUMMARY OF THE INVENTION

The invention provides a reproducible etching process for the manufacture of structures composed of layers of metal silicides or double layers of metal silicide-polysilicon with structure widths up to about 1 μm, whereby:

(a) a strict anisotropy occures, i.e., no undercutting;
(b) a good selectivity relative to the layers ($SiO_2$) positioned below is insured;
(c) The use of photosensitive resists as an etching mask is feasible;
(d) Rather high etching rates can be attained, i.e., short etching times; and
(e) the etching reaction occurs as uniformly as possible.

In accordance with the principles of the invention, an etching process of the type earlier described is accomplished in two steps, with a first etching occurring with a high frequency power output greater than 0.3 W/cm² at a relatively high etching rate and a second etching occurs with a high frequency power output of less than 0.2 W/cm² at a lower etching rate. The second etching achieves a good selectivity to $SiO_2$.

In certain embodiments of the invention, the first etching occurs at a high frequency output in the range of 0.3 to 0.5 W/cm² and the second etching occurs at a high frequency output of about 0.1 W/cm².

In certain embodiments of the invention, the etching gas ($SF_6$) is diluted with an inert gas, such as helium, so as to increase plasma stability. Preferably, in these embodiments, a $SF_6$:He dilution ratio of about 1:5 (parts by volume) is utilized.

Since the etching reaction occurs at each silicon crystal disc, beginning from an edge, in certain embodiments of the invention, the silicon disc substrates are bordered with a metal ring, preferably composed of aluminum, so as to achieve uniformity of the etching reaction. Such metal rings change the gas flux in the plasma reactor in such a manner that etching uniformity is improved by about 30 to 40%. In order to achieve optimal results, the height of the rings must be properly selected. In an exemplary embodiment, metal rings having a height of 4 mm are optimal. Also, in order to avoid contaminating the wafers, it is advantageous to utilize the highest grade (or purity) of metal, preferably aluminum.

The invention is particularly useful for manufacture of structures composed of materials selected from the group consisting of tungsten silicide, molybdenum silicide and tantalum silicide. Silicides with any desired metal content can be etched with sulfur hexafluoride ($SF_6$). The etching rate decreases with an increased metal contact.

DESCRIPTION OF THE PREFERRED EMBODIMENTS

Semiconductor circuit structures consisting of layers composed of metal silicides or metal silicide-polysilicon are produced in accordance with the principles of the invention by reactive sputter etching with sulfur hexafluoride as the etching gas.

In accordance with the principles of the invention, the etching process occurs in two steps whereby the first etching step is carried out with a high frequency power of more than 0.3 W/cm² and second etching step is carried out with a high frequency power of less than 0.2 W/cm². This method is strictly anisotropic, even when a photosensitive resist is used as an etching mask, and is useful in the manufacture of fully integrated semiconductor circuits in MOS technology.

Figure 1:
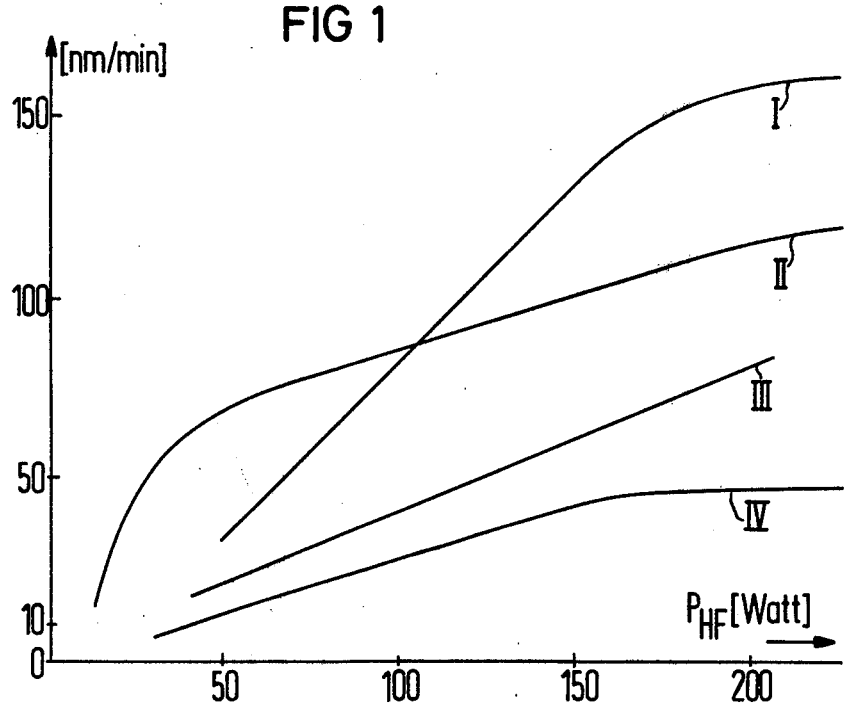
FIG. 1 is a graphical illustration showing the dependency of etching rates in nm/min on photosensitive resist, polysilicon, molybdenum silicide and $SiO_2$ as a function of high frequency power ($P_{HF}$) in watts.

FIG. 1 shows the dependency of etching rates for photosensitive resist (curve I), polysilicon (curve II), molybdenum silicide (curve III), and SiO₂ (curve IV) on the high frequency output utilized, with an etching gas comprised of a mixture of SF$_6$ and helium, at a dilution ration of SF$_6$: He of 1:5. As can be seen from these curves, polysilicon exhibits relatively high etching rates at relatively low high frequency power; in comparison to that of molybdenum silicide (curve III), the etching rate is approximately three times greater. The selectivity of polysilicon (curve II) relative to SiO$_2$ (curve IV) is greater than 10:1 at the second etching step.

Photosensitive resist (for example AZ 1450 I commercially available from the Shipley Company) can be used as an etching mask. The resist erosion lies in the range of the thickness of an etched double layer (approximately 500 nm).

Figure 2:
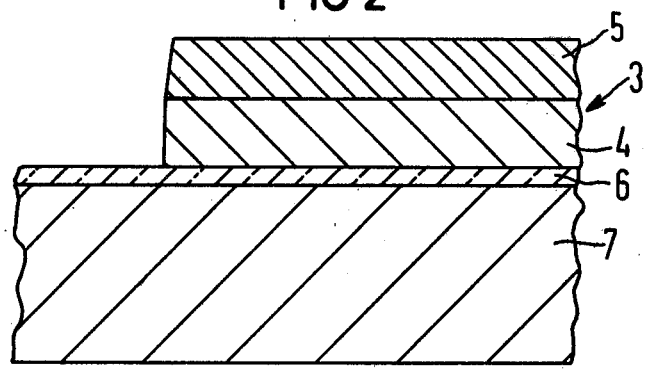
FIG. 2 is an elevated partial cross-sectional view of an etched structure consisting of a molybdenum silicide-polysilicon double layer produced in accordance with the principles of the invention (taken from a drawing of a scanning electron microscope picture enlarged 16,000 times).

In an exemplary embodiment, such as illustrated in FIG. 2, a double layer 3 consists of a 300 nm thick doped polysilicon layer 4 and a 200 nm thick molybdenum silicide layer 5, positioned thereon and having a molybdenum content of 35%. This structure was etched with the two step etching process earlier described and, as shown by FIG. 2, a strictly anisotropic etching process occurred. No undercutting of the polysilicon layer 4, under the molybdenum silicide layer 5, occured, although the etching rate of polysilicon (layer 4) is about three times as high as that for molybdenum silicide (layer 5). The selectivity of the polysilicon layer 4 as compared to the SiO$_2$ layer 6 lying below it, is very high. The semiconductor substrate 7 is composed of silicon. In the illustration, the photo-resist etching mask has already been removed.

With the inventive process, the etching times for a double layer 3 composed of polysilicon layer 4 and molybdenum-silicide layer 5 is about 12 minutes whereas in known etching methods (for example etching in CF$_4$-plasma) the etching times for such double layer is more than twice as long.

As is apparent from the foregoing specification, the present invention is susceptible of being embodied with various alterations and modifications which may differ particularly from those that have been described in the preceding specification and description. For this reasons, it is to be fully understood that all of the foregoing is intended to be merely illustrative and is not to be construed or interpreted as being restrictive or otherwise limiting of the present invention, excepting as it is set forth and defined in the hereto-appended claims.

I claim as my invention:

1. In a method of producing structures comprised of layers consisting of silicides or double layers of silicide-polysilicon on substrates containing integrated semiconductor circuits by reactive sputter etching with sulfur hexafluoride (SF$_6$) as the etching gas with the use of a photosensitive resist mask, the improvement comprising wherein:

said etching process is accomplished in two steps, with a first etching step being carried out with a relatively high frequency power of more than about 0.3 W/cm² at relatively high etching rates, and a second etching step being carried out with a relatively lower high frequency power of less than about 0.2 W/cm² at relatively lower etching rates.

2. In a method as defined in claim 1 wherein said first etching step occurs at a high frequency power in the range of about 0.3 through 0.5 W/cm².

3. In a method as defined in claim 1 wherein said second etching step occurs at a high frequency power of about 0.1 W/cm².

4. In a method as defined in claim 1 wherein said etching gas is diluted with helium.

5. In a method as defined in claim 4 wherein the etching gas is diluted with helium at the SF$_6$:He ratio of 1:5, by parts volume.

6. In a method as defined in claim 1 wherein said substrate is provided with a metal ring during the sputter etching in order to make the etching reaction more uniform.

7. In a method as defined in claim 6 wherein said metal ring is composed of aluminum.

8. In a method as defined in claim 1 wherein said silicides are selected from the group consisting of tungsten silicide, molybdenum silicide and tantalum silicide.

* * * * *